US009099487B2

(12) United States Patent
Chen et al.

(10) Patent No.: US 9,099,487 B2
(45) Date of Patent: Aug. 4, 2015

(54) ZENER DIODE DEVICES AND RELATED FABRICATION METHODS

(71) Applicants: Weize Chen, Phoenix, AZ (US); Xin Lin, Phoenix, AZ (US); Patrice M. Parris, Phoenix, AZ (US)

(72) Inventors: Weize Chen, Phoenix, AZ (US); Xin Lin, Phoenix, AZ (US); Patrice M. Parris, Phoenix, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/098,194

(22) Filed: Dec. 5, 2013

(65) Prior Publication Data

US 2015/0162417 A1   Jun. 11, 2015

(51) Int. Cl.
| | |
|---|---|
| H01L 29/861 | (2006.01) |
| H01L 31/107 | (2006.01) |
| H01L 29/66 | (2006.01) |
| H01L 29/866 | (2006.01) |

(52) U.S. Cl.
CPC ........ *H01L 29/66106* (2013.01); *H01L 29/866* (2013.01)

(58) Field of Classification Search
CPC ... H01L 29/861; H01L 29/866; H01L 29/868; H01L 27/0255; H01L 31/107
USPC .......... 257/603, 605, E29.335; 438/328, 545, 438/983
See application file for complete search history.

(56) References Cited

U.S. PATENT DOCUMENTS

| | | | |
|---|---|---|---|
| 4,079,402 A | | 3/1978 | Dunkley et al. |
| 4,441,114 A | | 4/1984 | Muggli |
| 4,672,403 A | | 6/1987 | Jennings |
| 4,758,537 A | | 7/1988 | Jennings |
| 5,276,350 A | * | 1/1994 | Merrill et al. .................. 257/603 |
| 5,602,404 A | * | 2/1997 | Chen et al. ..................... 257/112 |
| 6,605,859 B1 | | 8/2003 | Romas, Jr. et al. |
| 6,706,606 B2 | | 3/2004 | Romas, Jr. et al. |
| 6,933,546 B2 | | 8/2005 | Khemka et al. |
| 7,164,566 B2 | | 1/2007 | Xu et al. |
| 7,309,638 B2 | | 12/2007 | Khemka et al. |
| 7,701,012 B2 | | 4/2010 | Xu et al. |
| 7,911,750 B2 | | 3/2011 | Zhan et al. |
| 8,198,703 B2 | | 6/2012 | Lin et al. |

(Continued)

OTHER PUBLICATIONS

Chen W., U.S. Appl. No. 13/601,831, filed Aug. 31, 2012.

(Continued)

*Primary Examiner* — Phuc Dang
(74) *Attorney, Agent, or Firm* — Ingrassia Fisher & Lorenz, P.C.

(57) ABSTRACT

Zener diode structures and related fabrication methods and semiconductor devices are provided. An exemplary semiconductor device includes first and second Zener diode structures. The first Zener diode structure includes a first region, a second region that is adjacent to the first region, and a third region adjacent to the first region and the second region to provide a junction that is configured to influence a first reverse breakdown voltage of a junction between the first region and the second region. The second Zener diode structure includes a fourth region, a fifth region that is adjacent to the fourth region, and a sixth region adjacent to the fourth region and the fifth region to provide a junction configured to influence a second reverse breakdown voltage of a junction between the fourth region and the fifth region, wherein the second reverse breakdown voltage and the first reverse breakdown voltage are different.

16 Claims, 7 Drawing Sheets

(56) References Cited

U.S. PATENT DOCUMENTS

| | | | |
|---|---|---|---|
| 8,492,866 B1 * | 7/2013 | Anderson et al. | 257/481 |
| 2006/0014342 A1 | 1/2006 | Khemka et al. | |
| 2006/0208340 A1 * | 9/2006 | Glenn et al. | 257/603 |
| 2008/0203534 A1 | 8/2008 | Xu et al. | |
| 2009/0213506 A1 | 8/2009 | Zhan et al. | |
| 2009/0278168 A1 | 11/2009 | Hwang et al. | |
| 2010/0244088 A1 | 9/2010 | Whitfield et al. | |
| 2011/0175199 A1 | 7/2011 | Lin et al. | |
| 2012/0211747 A1 | 8/2012 | Stribley et al. | |

OTHER PUBLICATIONS

USPTO, Office Action for U.S. Appl. No. 13/601,831, mailed May 7, 2014.
USPTO, Response to Office Action for U.S. Appl. No. 13/601,831, mailed Aug. 7, 2014.
USPTO, Office Action for U.S. Appl. No. 13/601,831, mailed Sep. 9, 2014.
USPTO, Response to Office Action for U.S. Appl. No. 13/601,831, mailed Dec. 9, 2014.
USPTO, Notice of Allowance and Fee(s) Due for U.S. Appl. No. 13/601,831, mailed Jan. 14, 2015.

* cited by examiner

ZENER DIODE DEVICES AND RELATED FABRICATION METHODS

TECHNICAL FIELD

Embodiments of the subject matter described herein relate generally to semiconductor devices, and more particularly, to Zener diode devices and related fabrication methods.

BACKGROUND

Zener diodes are used in a number of different applications. For example, a Zener diode may function as a shunt that prevents voltages across some other electrical circuitry configured electrically parallel to the Zener diode from exceeding a breakdown voltage of the electrical circuitry when the voltage exceeds the reverse bias breakdown voltage of the Zener diode. It is desirable for Zener diodes to exhibit a stable and reliable reverse breakdown voltage with minimal leakage current. However, achieving this objective is particularly challenging when integrating fabrication of the Zener diode into a fabrication process optimized for other devices on the semiconductor wafer (e.g., logic transistors and the like). While it is possible to add process steps that are optimized for the Zener diode to the fabrication process, this undesirably increases the fabrication costs. Furthermore, when the process steps optimized for other devices on the wafer are used to fabricate a Zener diode, the functionality and/or performance of traditional Zener diode structures may be constrained by the doping levels of the implants for the other devices on the wafer, which, in turn, limits the range of achievable breakdown voltages. Additionally, process variations attendant to fabricating traditional Zener diode structures may further exacerbate the effects of fabricating the Zener diode structures using process steps that are not tailored to the Zener diode.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to Zener diodes having a reverse breakdown voltage and/or leakage current that is capable of being tuned or otherwise adjusted by varying the length of the Zener junction between the anode and cathode regions without modifying the dopant concentrations of the respective anode and cathode regions. In this regard, exemplary Zener diode semiconductor device structures described herein include a third region adjacent to the anode and cathode regions that provides a p-n junction that is angled with respect to the Zener junction, such that a width of the depletion region of the p-n junction induced within the anode and/or cathode region by the third region influences the width of the depletion region of the Zener junction within the anode and/or cathode region via space charge sharing, which, in turn, influences the reverse breakdown voltage and/or leakage current of the Zener junction by a non-negligible amount. For example, in one or more embodiments, the width of the depletion region of the p-n junction induced by the third region influences the reverse breakdown voltage of the Zener junction by at least 50 milliVolts, that is, the difference between the reverse breakdown voltage of the Zener junction when the third region is present relative to what the reverse breakdown voltage of the Zener junction would be in the absence of the third region is greater than 50 mV. In exemplary embodiments, the p-n junction is substantially orthogonal to the Zener junction, where the proximity of the depletion region of the p-n junction with respect to the Zener junction allows the p-n junction to alter the space charge and electric field in the depletion region of the Zener junction to produce corresponding changes in the reverse breakdown voltage and leakage current of the Zener junction. In exemplary embodiments, the p-n junction is adjacent to the location along the Zener junction that would otherwise have the greatest electric field strength (or magnitude) within the anode region to reduce the electric field strength at that location within the anode region via sharing of space charge among overlapping depletions regions, thereby increasing the width of the depletion region of the Zener junction within the anode and cathode regions, which, in turn, increases the reverse breakdown voltage and decreases the leakage current of the Zener junction.

Figure 1:
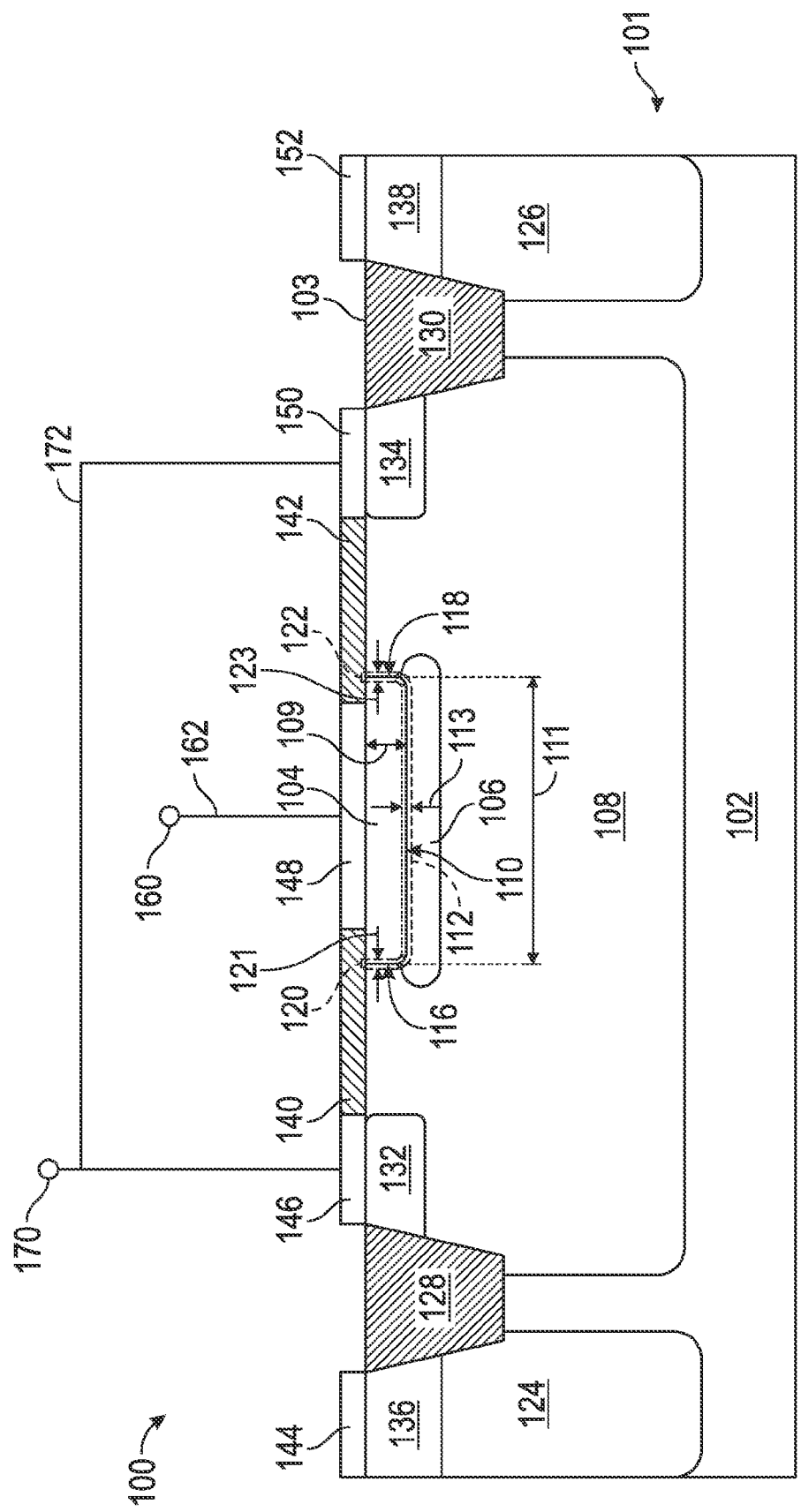
FIG. 1 depicts a cross-sectional view of an exemplary Zener diode device structure in accordance with one or more embodiments of the invention.

Referring to FIG. 1, in accordance with one or more embodiments, a Zener diode semiconductor device structure 100 includes a relatively heavily-doped anode region 104 having a first conductivity type that overlies a relatively heavily-doped cathode region 106 having the opposite conductivity type. The anode region 104 and the cathode region 106 are abutting or otherwise adjacent to one another with the common boundary (or border) of the anode and cathode regions 104, 106 defining a subsurface p-n junction 110 beneath the surface 103 of the substrate 101 of semiconductor material 102. For example, the heavily-doped anode region 104 may be realized as a p-type region of semiconductor material having a dopant concentration greater than about $5\times10^{17}/cm^3$, and the heavily-doped cathode region 106 may be realized as a n-type region of semiconductor material having a dopant concentration greater than about $5\times10^{17}/cm^3$. In exemplary embodiments, the depth 109 of the subsurface Zener junction 110 relative to the upper surface 103 of the substrate 101 is in the range of about 50 nanometers (nm) to about 700 nm. The subsurface p-n junction 110 functions as a Zener junction that exhibits a depletion region 112 having a width 113 that is less than or equal to 0.5 micrometers (or microns). The subsurface Zener junction 110 is oriented substantially parallel to the upper surface 103 of the substrate 101 such that current flowing through the Zener junction 110 is substantially perpendicular (or orthogonal) to the upper surface 103 of the substrate 101. Accordingly, for purposes of explanation, the Zener junction 110 may alternatively be referred to herein as a vertical junction in reference to the current flow through the Zener junction 110, in that current flows through the Zener junction 110 substantially perpendicular to the horizontal surface 103 (or plane) of the semiconductor substrate 101 in a substantially vertical direction relative to the horizontal surface 103.

In the embodiment of FIG. 1, the Zener diode structure 100 includes a lighter doped cathode well region 108 having the same conductivity type as the more heavily-doped cathode region 106. For example, the lighter doped cathode well region 108 may be realized as an n-type region of semiconductor material having a dopant concentration in the range of about $2\times10^{15}/cm^3$ to about $5\times10^{18}/cm^3$. In the illustrated embodiment, the lighter doped well region 108 laterally circumscribes the more heavily-doped anode and cathode regions 104, 106 and thereby surrounds or otherwise encompasses the anode and cathode regions 104, 106.

In the illustrated embodiment of FIG. 1, both the anode region 104 and the cathode region 106 are abutting or otherwise adjacent to the cathode well region 108 with the common boundaries (or borders) of the cathode well region 108 and anode region 104 defining surface p-n junctions 116, 118 oriented substantially perpendicular or orthogonal to the surface 103 of the substrate 101. In this regard, the surface p-n junctions 116, 118 are also substantially perpendicular or orthogonal to the Zener junction 110. For purposes of explanation, the surface p-n junctions 116, 118 may alternatively be referred to herein as lateral or horizontal junctions in that current flows substantially in a horizontal direction (or laterally) through the surface p-n junctions 116, 118 and substantially parallel to the horizontal surface 103 (or plane) of the semiconductor substrate 101. By virtue of the relatively lighter dopant concentration of the cathode well region 108 with respect to the cathode region 106, the widths 121, 123 of the lateral surface junction depletion regions 120, 122 are greater than or equal to 113, the width of the depletion of depletion region 112, such that the reverse breakdown voltage of the lateral surface p-n junctions 116, 118 is greater than the reverse breakdown voltage of the vertical Zener junction 110, typically by about 0.2 Volts or more. In this regard, when the electrical potential (or voltage) of the anode region 104 exceeds the electrical potential (or voltage) of the cathode region 106 by a sufficient amount, avalanche breakdown occurs along vertical Zener junction 110 within depletion region 112. In exemplary embodiments, length 111 of the Zener junction 110 is chosen such that the distance between opposing lateral surface p-n junctions 116, 118 and/or the distance between the midpoint (or center) of the Zener junction 110 and the lateral surface p-n junctions 116, 118 results in the desired reverse breakdown voltage for the Zener junction 110.

In exemplary embodiments, the lateral surface p-n junctions 116, 118 exhibit depletion regions having widths 121, 123 that are great enough relative to the length 111 of the vertical Zener junction 110 such that the depletion regions 120, 122 of the lateral junctions 116, 118 influence the reverse breakdown voltage of the vertical Zener junction 110. In this regard, varying the length 111 of the vertical Zener junction 110 varies the amount of charge sharing among the depletion regions 112, 120, 122, thereby dictating the reverse breakdown voltage of the vertical Zener junction 110. In other words, the length 111 of the vertical Zener junction 110 may be chosen such that the reverse breakdown occurs within depletion region 112 at or near the midpoint of the length 111 of the vertical Zener junction 110, with the reverse breakdown voltage of the vertical Zener junction 110 being dependent on the length 111 of the vertical Zener junction 110. In this regard, the reverse breakdown voltage can vary based on changes to the vertical junction length 111, such that the Zener diode structure 100 is capable of achieving different reverse breakdown voltages without changing the dopant concentration of any of the constituent regions 104, 106, 108. Prior to the avalanche breakdown within the depletion region 112, when the electrical potential (or voltage) of the cathode regions 106, 108 exceeds the electrical potential (or voltage) of the anode region 104, the lateral junction depletion regions 120, 122, via space charge sharing, among the depletion regions 112, 120, 122, decreases the electric field across depletion region 112 which, in turn decreases the leakage current of the Zener diode structure 100. In this regard, the lateral p-n junctions 116, 118 are adjacent to the corner locations along the Zener junction 110 that would otherwise have the greatest electric field strength (or magnitude) within the anode region 104 to reduce the electric field strength at the corners of the anode region 104 via sharing of space charge among overlapping depletion regions, which also increases the reverse breakdown voltage of the Zener junction 110. Thus, further reducing the length 111 of the Zener junction 110 results in the depletion regions 120, 122 further increasing the width 113 of the depletion region 112, thereby further reducing the electric field strength, increasing the reverse breakdown voltage, and decreasing the leakage current. For example, the length 111 of the vertical Zener junction 110 may be less than the widths 121, 123 of the depletion regions 120, 122, such that the space charge of the depletion regions 120, 122 of the p-n junctions 116, 118 influence the space charge of the depletion region 112 at or near the midpoint of the length 111 of the Zener junction 110, and thereby regulate the reverse breakdown voltage of the vertical Zener junction 110. In one or more exemplary embodiments, the length 111 of the vertical Zener junction 110 is in the range of about 0.2 microns to about 0.8 microns and the depth of the vertical Zener junction is in the range of about 0.05 microns to about 0.75 microns, and the dopant concentration of the cathode well region 108 is chosen such that the widths 121, 123 of the depletion regions 120, 122 are in the range of about 0.05 microns to about 0.4 microns to provide a reverse breakdown voltage of about 4.0 Volts to about 12 Volts.

Still referring to FIG. 1, in the illustrated embodiment, regions 140, 142 of a silicide blocking material are formed or otherwise provided on the upper surface 103 of the substrate 101 overlying the boundaries of the anode region 104 with the cathode well region 108. The silicide blocking regions 140, 142 overlie or otherwise overlap the outer portions of the anode region 104 and the inner portions of the cathode well region 108 to prevent subsequent formation of an overlying silicide contact that would overlap or otherwise electrically connect the cathode well region 108 to the anode region 104.

After the silicide blocking regions 140, 142 are formed on the substrate 101, silicide contacts 144, 146, 148, 150, 152 are formed on the substrate 101 to facilitate electrical connections to/from the Zener diode structure 100 to other electrical circuitry. As illustrated, a silicide contact 148 may be formed on the exposed interior portion of the anode region 104 and function as the anode contact for the Zener diode structure 100, however, in alternative embodiments, the anode contact may be formed on a relatively heavier-doped region that is electrically connected to the anode region 104, as described in greater detail below in the context of FIG. 7. Silicide contacts 146, 150 are formed on portions of the cathode well region 108 and function as the cathode contacts for the Zener diode structure 100. In exemplary embodiments, relatively heavier-doped contact regions 132, 134 of semiconductor material are formed within portions of the cathode well region 108 to provide a relatively low resistance electrical connection from/to the cathode contacts 146, 150 to/from the cathode well region 108. Isolation regions 128, 130 of dielectric material may also be formed about the perimeter (or periphery) of the cathode well region 108 to isolate the upper surface of the cathode well region 108 from adjacent devices. In the illustrated embodiment, well regions 124, 126 of semiconductor material having the same conductivity type as the underlying semiconductor material 102 and the opposite conductivity type as the cathode well region 108 are formed about the perimeter (or periphery) of the portion of the substrate 101 utilized for the Zener diode structure 100, and relatively higher-doped contact regions 136, 138 of semiconductor material having that conductivity type are formed within the substrate well regions 124, 126 to provide a relatively low resistance electrical connection from/to substrate contacts 144, 152 formed on the substrate contact regions 136, 138 to/from the substrate well regions 124, 126.

Fabrication of the Zener diode structure 100 will now be described. It should be understood that while the subject matter may be described in the context of the Zener diode structure 100 having a p-type anode region 104 and an n-type cathode regions 106, 108, 132, 134 for purposes of explanation, the subject matter described herein is not necessarily limited to Zener diodes having a p-type anode surrounded by an n-type cathode and Zener diodes having an n-type cathode surrounded by a p-type anode may be implemented in an equivalent manner by interchanging conductivities. In exemplary embodiments, isolation regions 128, 130 of dielectric material are formed in the substrate semiconductor material 102, for example, by performing shallow trench isolation (STI) by masking the substrate 101 with a masking material that is patterned to expose the desired portions of the substrate 101, etching the exposed portions of semiconductor material 102 to a desired depth to form trenches, and filling the trenches with a dielectric material (e.g., by performing a deposition process followed by a planarization process).

Either before or after forming the isolation regions 128, 130, the cathode well region 108 is formed by masking the substrate 101 with a masking material that is patterned to expose the interior portion of substrate semiconductor material 102 between the isolation regions 128, 130 and implanting ions into the exposed interior portion of p-type substrate semiconductor material 102. In exemplary embodiments, n-type ions, such as phosphorous ions or arsenic ions, are implanted with a dopant concentration in the range of about $5 \times 10^{15}/cm^3$ to about $5 \times 10^{18}/cm^3$, and at an energy level in the range of about 100 keV to about 2000 keV to provide the cathode well region 108 with a depth (after subsequent thermal annealing or any other diffusion) that is greater than a depth of the depletion region 112 of the subsequently formed Zener junction 110. Similarly, the substrate well regions 124, 126 may be formed by masking the substrate 101 with a masking material that is patterned to expose the peripheral portions of substrate semiconductor material 102 about the isolation regions 128, 130 and implanting ions with a dopant concentration that is greater than the dopant concentration of the p-type substrate semiconductor material 102. In exemplary embodiments, p-type ions, such as boron ions, are implanted with a dopant concentration in the range of about $1 \times 10^{16}/cm^3$ to about $1 \times 10^{19}/cm^3$ and at an energy level in the range of about 60 keV to about 1500 keV to provide the substrate well regions 124, 126 with a depth (after subsequent thermal annealing or any other diffusion) that is greater than a depth of the shallow isolation regions 128, 130. In exemplary embodiments where the Zener diode structure 100 is fabricated using a complementary metal-oxide-semiconductor (CMOS) fabrication process, the cathode well region 108 may be formed concurrently to forming n-well regions of PMOS logic transistors on other regions of the substrate 101 (e.g., by using the n-well implant for the cathode well region 108) while the substrate well regions 124, 126 may be formed concurrently to forming p-well regions of NMOS logic transistors on other regions of the substrate 101.

In exemplary embodiments, after forming the cathode well region 108, the cathode region 106 is formed by masking the substrate 101 with a masking material that is patterned to expose the interior portion of cathode well region 108 and implanting n-type ions, such as phosphorous ions or arsenic ions, into the exposed interior portion of the cathode well region 108. In exemplary embodiments, the ions for the cathode region 106 are implanted with a dopant concentration in the range of about $5 \times 10^{17}/cm^3$ to about $5 \times 10^{19}/cm^3$. Additionally, the ions are implanted at an energy level in the range of about 20 keV to about 150 keV to provide the cathode region 106 with a depth (after subsequent thermal annealing or any other diffusion) that is in the range of about 0.05 microns to about 1.0 microns relative to the surface 103 of the substrate 101. In this regard, the depth of the cathode region 106 is less than the depth of the cathode well region 108 such that the cathode region 106 is vertically and laterally encompassed or otherwise enclosed by the cathode well region 108. In some embodiments where the Zener diode structure 100 is fabricated using a CMOS fabrication process, the n-type ions are implanted at an angle between 1 and 10 degrees relative to the surface normal of the substrate 101, for example, concurrently to forming n-type halo regions within the n-well regions of PMOS logic transistors on other regions of the substrate 101 (e.g., by using the n-type halo implant for the cathode region 106).

After forming the cathode region 106, the anode region 104 is formed by masking the substrate 101 with a masking material that is patterned to expose the anode region 104 and implanting p-type ions, such as boron ions, into the exposed portion of the cathode region 106 with a dopant concentration in the range of about $5 \times 10^{17}/cm^3$ to about $5 \times 10^{20}/cm^3$, and at an energy level in the range of about 5 keV to about 100 keV to provide the anode region 104 with a depth (after subsequent thermal annealing or any other diffusion) that is in the range of about 0.05 microns to about 1.0 microns relative to the surface 103 of the substrate 101. It should be noted that the same implant mask used to form the cathode region 106 may also be used when forming the anode region 104. In exemplary embodiments where the Zener diode structure 100 is fabricated using a CMOS fabrication process, the anode region 104 may be formed concurrently to forming p-type source/drain extension regions for PMOS logic transistors on other regions of the substrate 101 (e.g., by using the p-type extension implant for the anode region 104). In accordance with one or more embodiments, the anode region 104 may be formed with a retrograde dopant profile so that the peak concentration of the anode region 104 is located beneath the surface of the substrate 101 and adjacent to the junction 110 with the cathode region 106.

Still referring to FIG. 1, after forming the anode and cathode regions 104, 106, fabrication of the Zener diode structure 100 continues with forming relatively shallow and relatively heavily-doped contact regions 132, 134, 136, 138 in the substrate 101. N-type cathode contact regions 132, 134 may be formed by masking the substrate 101 with a masking material that is patterned to expose portions of the cathode well region 108 and implanting n-type ions, such as phosphorous ions or arsenic ions, into the exposed portions of the cathode well region 108 with a dopant concentration in the range of about $1 \times 10^{19}/cm^3$ to about $1 \times 10^{21}/cm^3$ and at an energy level in the range of about 10 keV to about 100 keV to provide the n-type contact regions 132, 134 with a depth (after diffusion) that is less than the depth of the cathode well region 108. For example, in accordance with one or more embodiments, the depth of the shallow n-type cathode contact regions is in the range of about 0.05 microns to about 0.3 microns. In a similar manner, p-type substrate contact regions 136, 138 may be formed by masking the substrate 101 with a masking material that is patterned to expose at least portions of the substrate well regions 124, 126 and implanting p-type ions, such as boron ions, into the exposed substrate well regions 124, 126 with a dopant concentration in the range of about $1 \times 10^{19}/cm^3$ to about $1 \times 10^{21}/cm^3$ and at an energy level in the range of about 2 keV to about 50 keV to provide the p-type contact regions 136, 138 with a depth (after diffusion) that is less than the depth of the substrate well regions 124, 126. In exemplary embodiments where the Zener diode structure 100 is fabricated using a CMOS fabrication process, the cathode contact regions 132, 134 may be formed concurrently to forming n-type source/drain contact regions for NMOS logic transistors on other regions of the substrate 101 while the substrate contact regions 136, 138 may be formed concurrently to forming p-type source/drain contact regions for PMOS logic transistors on other regions of the substrate 101.

Fabrication of the Zener diode structure 100 may be completed by forming the contact blocking regions 140, 142 overlying the substrate 101 overlapping the portions of the anode region 104 adjacent to the cathode well region 108 and the portions of the cathode well region 108 adjacent to the anode region 104 and forming contacts 144, 146, 148, 150, 152 overlying the substrate 101. The contact blocking regions 140, 142 prevent subsequent formation of contact material on the underlying portions of the substrate 101 and include one or more contact blocking materials, such as, one or more oxide materials and/or one or more nitride materials. For example, in one embodiment, the contact blocking regions 140, 142 are formed by forming a layer of oxide material (which may function as a gate dielectric for the MOS logic transistors on other regions of the substrate 101) overlying the substrate 101, forming a layer of nitride material overlying the oxide material, and etching the oxide and nitride materials to expose the portions of the substrate 101 to be used for the contacts 144, 146, 148, 150, 152 while the remaining contact blocking material overlapping the boundaries of the anode region 104 with the cathode well region 108 remains intact. In some embodiments, the contact blocking regions 140, 142 are formed prior to forming the shallow contact regions 132, 134, 136, 138. After forming the contact blocking regions 140, 142, the contacts 144, 146, 148, 150, 152 may be formed, for example, by conformably depositing a layer of contact-forming metal onto the exposed surface 103 of the substrate 101 and heating the substrate 101, for example by rapid thermal annealing (RTA), to react the contact-forming metal with the exposed substrate semiconductor material 102 and form the metallic-semiconductor contacts 144, 146, 148, 150, 152 at the top of the contact regions 132, 134, 136, 138, the exposed interior portion of the anode region 104 between contact blocking regions 140, 142, and any exposed portions of the cathode well region 108.

In one or more embodiments, after fabrication of the Zener diode structure 100 is complete, an electrical connection 162 is provided from the anode contact 148 to a normally-lower voltage circuit node 160 (e.g., via one or more overlying metallization layers) with another electrical connection 172 being provided from the cathode contacts 146, 150 to a normally-higher voltage circuit node 170 (e.g., via one or more overlying metallization layers) such that the Zener diode structure 100 conducts current from the higher voltage circuit node 170 to the lower voltage circuit node 160 when the voltage at the higher voltage circuit node 170 relative to the lower voltage circuit node 160 exceeds the reverse breakdown voltage of the Zener diode structure 100, thereby constraining the voltage difference between nodes 160, 170 to a voltage substantially equal to the reverse breakdown voltage. In this manner, the Zener diode structure 100 may protect electrical circuitry coupled between the circuit nodes 160, 170 and configured electrically parallel to the Zener diode structure 100 from voltages that could potentially exceed the breakdown voltage of the electrical circuitry. As described above, the reverse breakdown voltage of Zener diode structure 100, which clamps voltage across the nodes 160, 170 being protected, is adjusted by varying the separation distance between the lateral junctions 116, 120 by increasing and/or decreasing the length 111 of the Zener junction 110. In some embodiments, an electrical connection may also be provided between the substrate contacts 144, 152 and the lower voltage circuit node 160 and/or the anode contact 148 to bias the underlying substrate semiconductor material 104 to the electrical potential at the lower voltage circuit node 160.

It should be noted that while FIG. 1 is described in the context of the vertical junction 110 having a lower reverse breakdown voltage than the lateral junctions 116, 118, in alternative embodiments, the lateral junctions 116, 118 can have a lower reverse breakdown voltage than the vertical junction 110, for example, by providing the cathode well region 108 with a dopant concentration greater than that of the cathode region 106. In such embodiments, the length 111 of the vertical junction 110 is reduced relative to the widths 121, 123 of the depletion regions 120, 122 so that the depletion region 112 of the vertical junction 110 and the depletion regions 120, 122 of lateral junctions 116, 118 influence one another through sharing of space charge to increase the width of each depletion region, and thereby increase the reverse breakdown voltage of the lateral junctions 116, 118. Additionally, the cathode well region 108 may have a retrograde dopant profile such that breakdown occurs away from the surface of the substrate 101. Furthermore, in some embodiments, the breakdown voltage of one of the junctions 116, 118 may be greater than that of the other of the junctions 116, 118, with the separation distance between the junctions 116, 118 being reduced so that space charge sharing by the depletion region of the junction 116, 118 with the higher breakdown voltage increases the depletion region of the other junction 116, 118.

Figure 2:
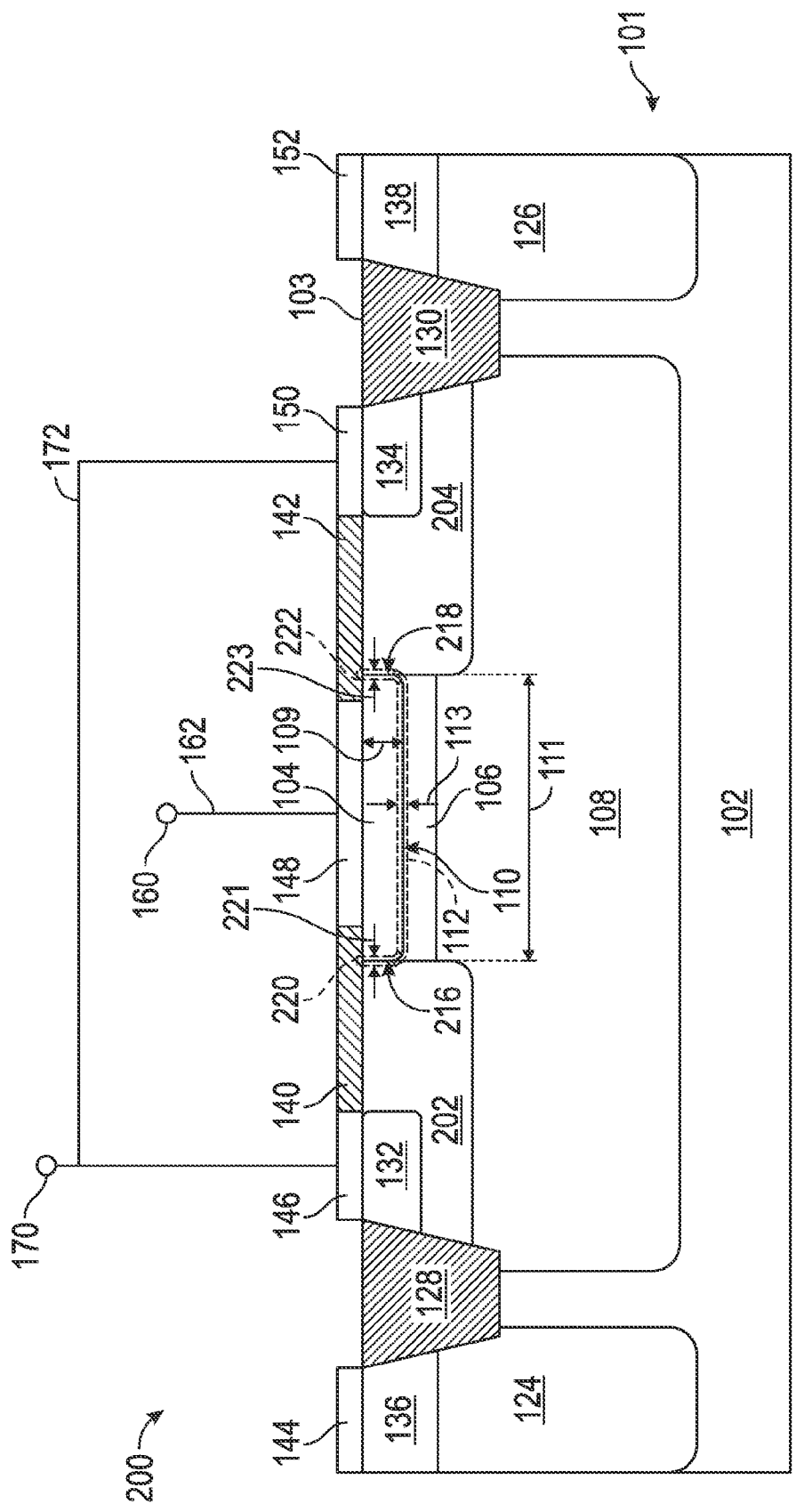
FIG. 2 depicts a cross-sectional view of another exemplary Zener diode device structure in accordance with one or more embodiments of the invention.

Referring now to FIG. 2, in accordance with one or more embodiments, a Zener diode semiconductor device structure 200 includes additional doped cathode well enhancement regions 202, 204 adjacent to the anode region 104 to surround or otherwise encompass the anode region 104 laterally. The cathode well enhancement regions 202, 204 have the conductivity type opposite that of the anode region 104 to define surface p-n junctions 216, 218 between the cathode well enhancement regions 202, 204 and the anode region 104 that are substantially perpendicular or orthogonal to the Zener junction 110 and to the surface 103 of the substrate 101. In this regard, the cathode well enhancement regions 202, 204 have the same conductivity type as the cathode regions 106, 108.

In one or more exemplary embodiments, the dopant concentration of the cathode well enhancement regions 202, 204 is greater than the dopant concentration of the cathode well region 108 but less than the dopant concentration of the cathode region 106, such that the widths 221, 223 of the surface junction depletion regions 220, 222 are less than the widths 121, 123 of the surface junction depletion regions 120, 122 of the embodiment of FIG. 1. For example, the cathode well enhancement regions 202, 204 may have an n-type dopant concentration in the range of about $1 \times 10^{16}/cm^3$ to about $8 \times 10^{18}/cm^3$, while the cathode well region 108 has an n-type dopant concentration in the range of about $5 \times 10^{15}/cm^3$ to about $1 \times 10^{18}/cm^3$ and the cathode region 106 has an n-type dopant concentration in the range of about $5 \times 10^{16}/cm^3$ to about $5 \times 10^{19}/cm^3$. In a similar manner as described above, the widths 221, 223 of the surface junction depletion regions 220, 222 are greater than the width 113 of the subsurface vertical junction depletion region 112 such that avalanche breakdown still occurs along the vertical Zener junction 110 within depletion region 112, and the widths 221, 223 that are great enough relative to the length 111 of the vertical Zener junction 110 such that the depletion regions 220, 222 of the lateral junctions 216, 218 influence the reverse breakdown voltage of the vertical Zener junction 110. In this regard, for the same length 111 of the vertical Zener junction 110, the Zener diode structure 200 achieves a reverse breakdown voltage that is greater than the reverse breakdown voltage for the Zener diode structure 100 of FIG. 1 while also achieving a leakage current that is less than the leakage current for the Zener diode structure 100.

The Zener diode structure 200 of FIG. 2 may be fabricated in a similar manner as described above in the context of FIG. 1. In this regard, to fabricate the Zener diode structure 200, after forming the cathode well region 108, the cathode well enhancement regions 202, 204 may be formed by masking the substrate 101 with an appropriately patterned implantation mask and implanting n-type donor ions, to increase the dopant concentration, or p-type acceptor ions, to decrease the dopant concentration, into the exposed portions of the cathode well region 108 at an energy level in the range of about 5 keV to about 200 keV to provide the n-type cathode well enhancement regions 202, 204 with a depth (after diffusion) that is greater than the resulting depth of the subsequently-formed anode region 104 and less than the depth of the cathode well region 108. In exemplary embodiments, the resulting depth of the cathode well enhancement regions 202, 204 is also greater than the resulting depth of the subsequently-formed cathode region 106 so that the cathode well enhancement regions 202, 204 laterally circumscribe, surround or otherwise encompass both the anode and cathode regions 104, 106. For example, in accordance with one or more embodiments, the depth of the cathode well enhancement regions 202, 204 is greater than about 0.6 microns. After the cathode well enhancement regions 202, 204 are formed, the anode and cathode regions 104, 106 may be formed within the cathode well region 108 between the cathode well enhancement regions 202, 204 and the fabrication of the Zener diode structure 200 may be completed in a similar manner as described above in the context of FIG. 1.

Figure 3:
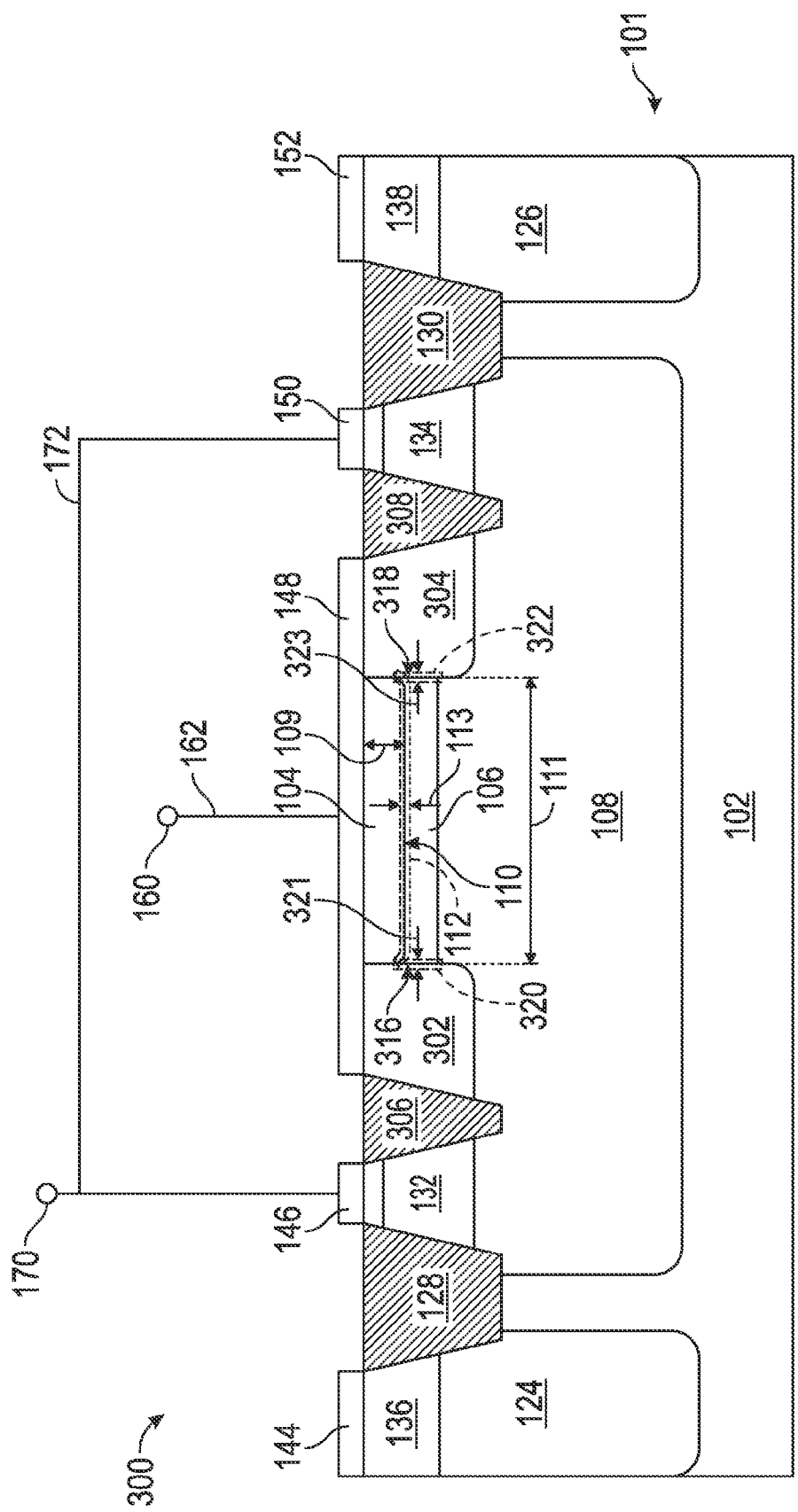
FIG. 3 depicts a cross-sectional view of another exemplary Zener diode device structure in accordance with one or more embodiments of the invention.

Referring now to FIG. 3, in accordance with one or more embodiments, a Zener diode semiconductor device structure 300 includes additional doped anode enhancement regions 302, 304 adjacent to the anode and cathode regions 104, 106 to laterally circumscribe, surround or otherwise encompass the anode and cathode regions 104, 106. The anode enhancement regions 302, 304 have the same conductivity type as the anode region 104 to define subsurface lateral p-n junctions 316, 318 between the anode enhancement regions 302, 304 and the cathode region 106 that are substantially perpendicular or orthogonal to the vertical Zener junction 110 and to the surface 103 of the substrate 101.

In an exemplary embodiment of the Zener diode semiconductor device structure 300, the dopant concentration of the anode region 104 is greater than or equal to the dopant concentration of the cathode region 106 such that the width of the depletion region of the vertical Zener junction 110 extends further into the cathode region 106 than the anode region 104 to allow space charge sharing with the depletion regions 320, 322 of the lateral junctions 316, 318. For example, the dopant concentration of the anode region 104 may be about $8 \times 10^{18}/cm^3$ and the cathode region 106 may be about $1 \times 10^{18}/cm^3$. In exemplary embodiments, the dopant concentration of the anode enhancement regions 302, 304 is greater than the dopant concentration of the anode region 104 but low enough such that the vertical Zener junction 110 between anode region 104 and cathode region 106 remains the lowest breakdown junction. In this regard, the vertical Zener junction 110 has a lower breakdown voltage than the lateral junctions 316, 318 by virtue of the dopant concentration of the cathode region 106 decreasing as the depth relative to the surface of the substrate 101 increases. However, it should be noted that in alternative embodiments of the Zener diode semiconductor device structure 300, the lateral junctions 316, 318 can have a lower reverse breakdown voltage than the vertical junction 110.

In a similar manner as described above, the length 111 of the vertical Zener junction 110 is chosen such that the widths 321, 323 of the lateral junction depletion regions 320, 322 are great enough relative to the length 111 of the vertical Zener junction 110 such that the depletion regions 320, 322 of the lateral junctions 316, 318 influence the reverse breakdown voltage of the vertical Zener junction 110. Accordingly, the sharing of space charge at the locations where the vertical Zener junction 110 meets or intersects the lateral junctions 316, 318 (e.g., the adjacent corners of regions 104, 106) increase the effective width 113 of the depletion region 112 within the cathode region 106, thereby increasing the reverse breakdown voltage of the vertical Zener junction 110 relative to what it would otherwise be for the same length 111 in the absence of the anode enhancement regions 302, 304. It will be appreciated that the widths 321, 323 of the lateral junction depletion regions 320, 322 within the cathode region 106 may be varied (e.g., by varying the dopant concentration of the anode enhancement regions 302, 304) to achieve a desired reverse breakdown voltage for a given junction length 111. Additionally, it should be noted that for some device geometries, the junctions between the anode enhancement regions 302, 304 and the cathode well region 108 may influence space charge sharing among the depletion regions 112, 320, 322. In other words, the junctions between the anode enhancement regions 302, 304 and the cathode well region 108 may also influence the reverse breakdown voltage of the Zener junction 110. Similarly, in alternative embodiments of the Zener diode semiconductor device structure 300 where the lateral junctions 316, 318 have a lower reverse breakdown voltage than the vertical junction 110, the junctions between the anode enhancement regions 302, 304 and the cathode well region 108 may influence the reverse breakdown voltage of the lateral junctions 316, 318.

The Zener diode structure 300 of FIG. 3 may be fabricated in a similar manner as described above in the context of FIG. 1. In this regard, to fabricate the Zener diode structure 300, isolation regions 306, 308 of dielectric material may be formed concurrently to isolation regions 128, 130, with isolation regions 306, 308 being formed at locations on the substrate 101 such that they reside between the subsequently-formed cathode contact regions 132, 134 and the anode enhancement regions 302, 304. The anode enhancement regions 302, 304 may be formed concurrently to forming the substrate contact regions 136, 138, for example, by masking the substrate 101 with an appropriately patterned implantation mask and implanting p-type ions, such as boron ions, into exposed portions of the cathode well region 108 adjacent to the anode and cathode regions 104, 106 with a dopant concentration in the range of about $1 \times 10^{19}/cm^3$ to about $1 \times 10^{21}/cm^3$ and at an energy level in the range of about 2 keV to about 50 keV to provide the anode enhancement regions 302, 304 with a depth (after diffusion) that is greater than the depth of the anode region 104. In exemplary embodiments where the Zener diode structure 300 is fabricated using a CMOS fabrication process, the anode enhancement regions 302, 304 may be formed concurrently to forming p-type source/drain contact regions for PMOS logic transistors on other regions of the substrate 101. In the illustrated embodiment where the anode region 104 and the anode enhancement regions 302, 304 extend between the isolation regions 306, 308 to provide a contiguous region having the same conductivity type, fabrication of the Zener diode structure 300 may be completed without forming contact blocking regions overlying the substrate 101. In this regard, the anode contact 148 may be formed on the anode region 104 and the anode enhancement regions 302, 304.

Figure 4:
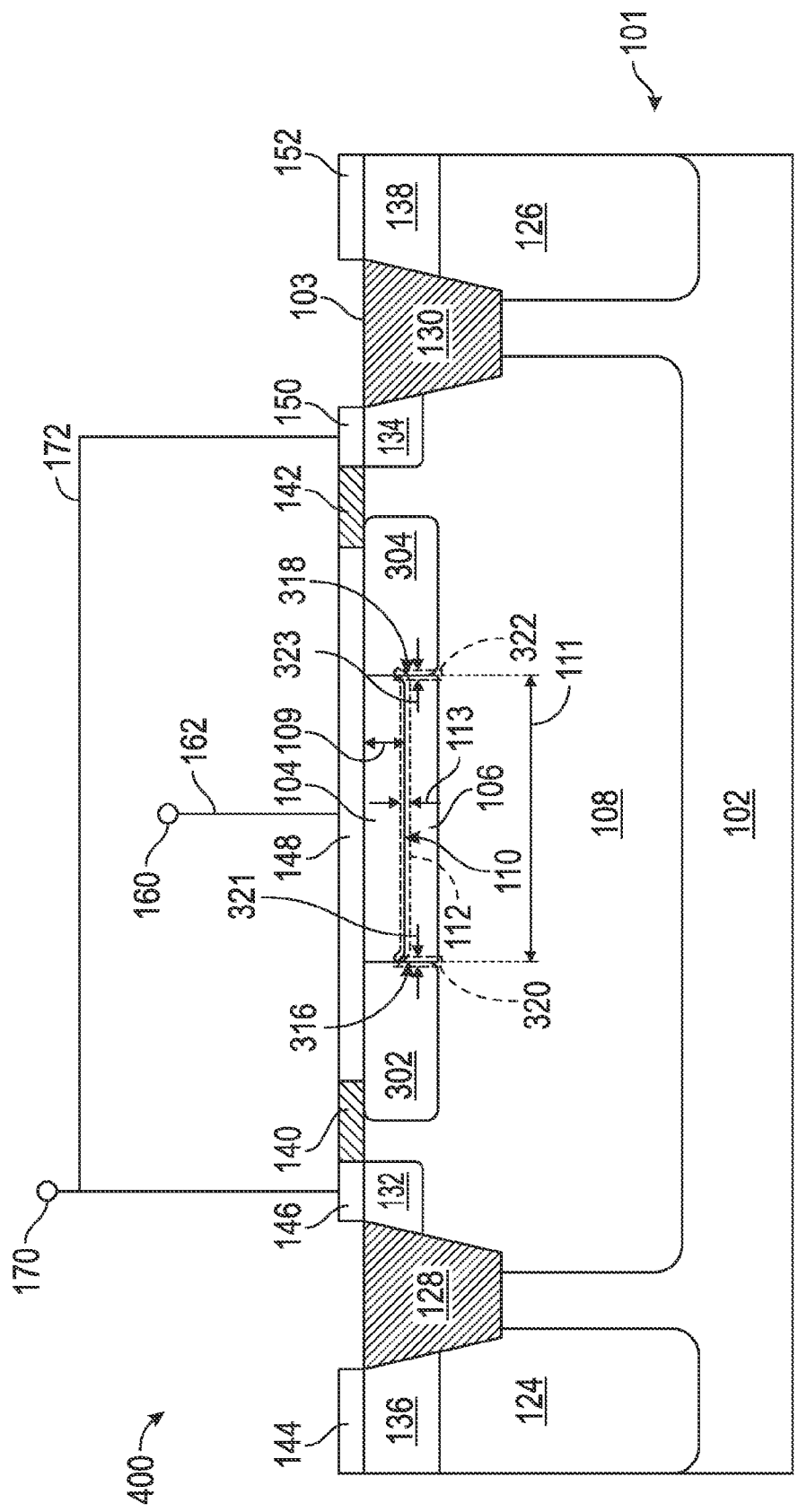
FIG. 4 depicts a cross-sectional view of another exemplary Zener diode device structure in accordance with one or more embodiments of the invention.

Referring now to FIG. 4, and with reference to FIGS. 1 and 3, in accordance with one or more embodiments, a Zener diode semiconductor device structure 400 includes contact blocking regions 140, 142 formed on the substrate 101 that overlap portions of the anode enhancement regions 302, 304 adjacent to cathode region 108 and portions of the cathode contact regions 132, 134 adjacent to the anode regions. In this regard, in alternative embodiments, the isolation regions 306, 308 may be removed from the Zener diode structure 300 of FIG. 3 with the contact blocking regions 140, 142 preventing formation of contacts that would otherwise electrically connect the anode enhancement regions 302, 304 to neighboring cathode contact regions 132, 134. In the embodiment of FIG. 4, the anode enhancement regions 302, 304 may be spaced apart from neighboring cathode contact regions 132, 134 by a nonzero lateral separation distance that is less than the lateral width of the isolation regions 306, 308, thereby reducing the area (or footprint) of the Zener diode structure 400 of FIG. 4 relative to the Zener diode structure 300 of FIG. 3.

Figure 5:
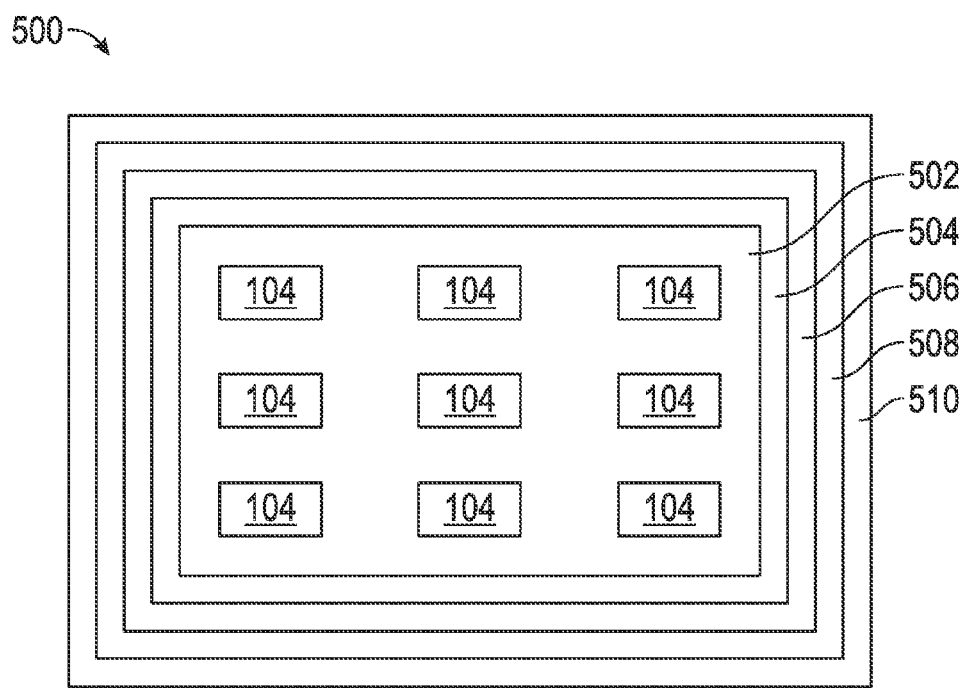
FIG. 5 depicts a top view of another exemplary Zener diode device structure in accordance with one or more embodiments of the invention.

Referring now to FIG. 5, in accordance with one or more embodiments, to achieve higher current handling capability, arrayed Zener diode semiconductor device structure 500 may be fabricated. FIG. 5 depicts a top view of the arrayed Zener diode semiconductor device structure 500, which includes multiple instances of the anode region 104 disposed on an interior region of a substrate 101. Again, it will be appreciated that FIG. 5 is not drawn to scale, but rather, is drawn in a simplified manner for clarity and purposes of explanation. Each instance of the anode region 104 overlies an instance of cathode region 106 and is laterally circumscribed, surrounded, or otherwise encompassed by an adjacent region 502 of semiconductor material (either cathode well region 108 for the embodiment of FIG. 1, cathode enhancement regions 202, 204 for the embodiment of FIG. 2, or anode enhancement regions 302, 304 for the embodiments of FIGS. 3-4) that defines lateral p-n junctions between the anode region 104 (for the embodiments of FIGS. 1-2) or the underlying cathode region 106 (for the embodiments of FIGS. 3-4).

In the illustrated embodiment of FIG. 5, the region 502 is realized as an anode enhancement region (e.g., anode enhancement regions 302, 304) having the same conductivity type as the anode regions 104 as described in the context of FIGS. 3-4, wherein a surface isolation region 504 of dielectric material (e.g., isolation regions 306, 308) or contact blocking material (e.g., regions 140, 142) laterally circumscribes, surrounds, or otherwise encompasses the anode enhancement region 502 to electrically isolate the upper surface of the anode enhancement region 502 from a cathode contact region 506 (e.g., cathode contact regions 132, 134) that laterally circumscribes, surrounds, or otherwise encompasses the surface isolation region 504. A surface isolation region 508 of dielectric material (e.g., isolation regions 128, 130) may laterally circumscribe, surround, or otherwise encompass the cathode contact region 506 to electrically isolate the upper surface of the cathode contact region 506 from a substrate contact region 510 (e.g., substrate contact regions 136, 138).

Figure 6:
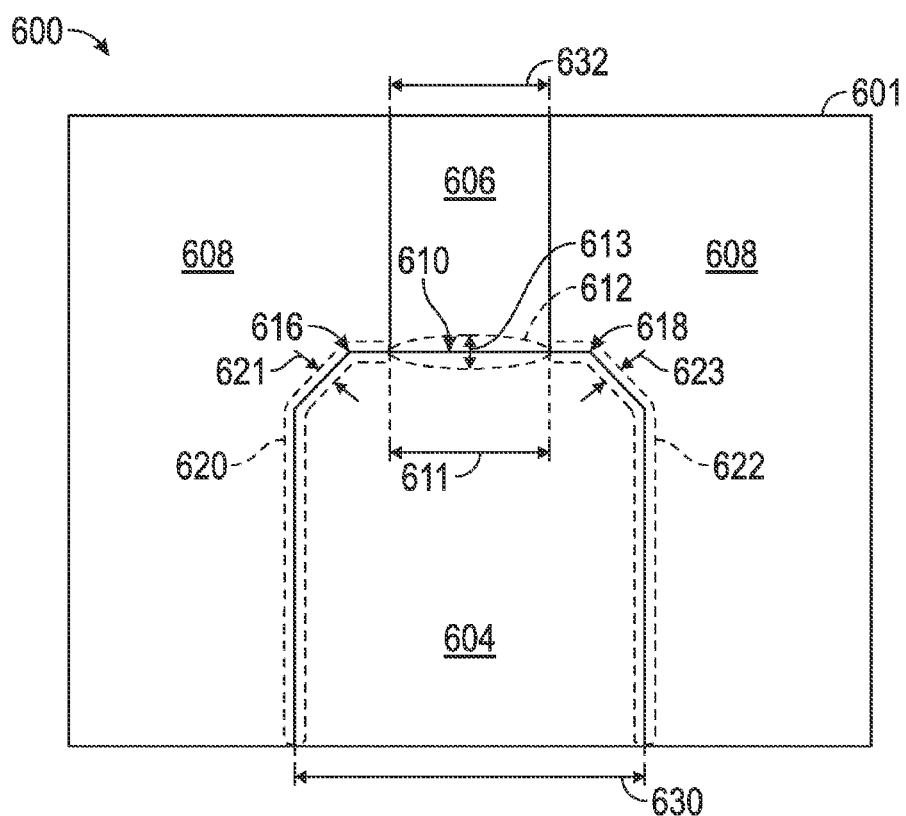
FIG. 6 depicts a top view of another exemplary Zener diode device structure in accordance with one or more embodiments of the invention.

FIG. 6 depicts a top view of a lateral Zener diode semiconductor device structure 600 in accordance with one or more alternate embodiments. The lateral Zener diode semiconductor device structure 600 includes an anode region 604 of semiconductor material having a first conductivity type that is adjacent to a cathode region 606 of semiconductor material having the opposite conductivity type to provide a lateral surface p-n junction 610 substantially perpendicular or orthogonal to the surface of the substrate 601 at the common boundary or border of the anode and cathode regions 604, 606. In exemplary embodiments, the lateral surface p-n junction 610 is realized as a Zener junction such that the depletion region 612 defined by the lateral surface p-n junction 610 is less than 0.5 microns. In the illustrated embodiment, the anode and cathode regions 604, 606 are formed within a doped cathode well region 608 having the same conductivity type as the cathode region 606 and a dopant concentration that is greater than or equal to the dopant concentration of the anode region 604. The common boundaries or borders of the cathode well region 608 and anode region 604 defines additional lateral surface p-n junctions 616, 618. In a similar manner as described above, in exemplary embodiments, the dopant concentration of the cathode well region 608 is less than the dopant concentration of the cathode region 606 so that the widths 621, 623 of the lateral depletion regions 620, 622 defined by the interfaces between the cathode well region 608 and anode region 604 are greater than the width 613 of the lateral depletion region 612 defined by the interface between the anode and cathode regions 604, 606 such that avalanche breakdown occurs along lateral Zener junction 610 within depletion region 612 initially at or near the midpoint of the length 611 of the Zener junction 610.

In exemplary embodiments, the length 611 of the lateral Zener junction 610, the width 630 of the anode region 604, and/or the width 632 of the cathode region 606 are varied to regulate or otherwise control the manner in which the depletion regions 620, 622 of the adjacent lateral p-n junctions 616, 618 influence the reverse breakdown voltage and/or leakage current of the lateral Zener junction 610. In this regard, the narrower of the anode width 630 and the cathode width 632 substantially dictates the length 611 of the lateral Zener junction 610, while the larger of the anode width 630 and the cathode width 632 dictates the amount of space charge sharing. For example, in the illustrated embodiment, increasing the anode width 630 relative to the cathode width 632 decreases the amount of space charge sharing among the depletion regions 612, 620, 622. Additionally, the corner portions of the anode region 604 proximate the cathode region 606 may be chamfered away from the cathode region 606. Thus, portions of the lateral p-n junctions 616, 618 and/or lateral depletion regions 620, 622 are obliquely angled with respect to the Zener junction 610 and/or Zener depletion region 612 to control the degree of charge sharing and tune the breakdown of the lateral Zener junction 610 without adjusting the doping concentrations of regions 604, 606 and 608. This also eliminates right-angled corners which could contribute to premature and/or poorly controlled breakdowns. In this regard, not only may the relationship between the widths 630, 632 of the anode and cathode regions 604, 606 be varied to adjust the manner in which the depletion regions 620, 622 influence the Zener depletion region 612, but the angle at which proximal corner portions of the anode region 604 are chamfered away from the adjacent cathode region 606 (or alternatively, the angle at which proximal corner portions of the cathode region 606 are chamfered away from the adjacent anode region 604) may also be varied to adjust the manner in which the depletion regions 620, 622 influence the Zener depletion region 612. In alternative embodiments, the width 630 of the anode region 604 may be greater than the width 632 of the cathode region 606 and/or the angle of the chamfer of the corner portions of the cathode region 606 proximate the anode region 604 may be varied in order to control the degree of charge sharing, and thereby, the desired breakdown voltage.

Figure 7:
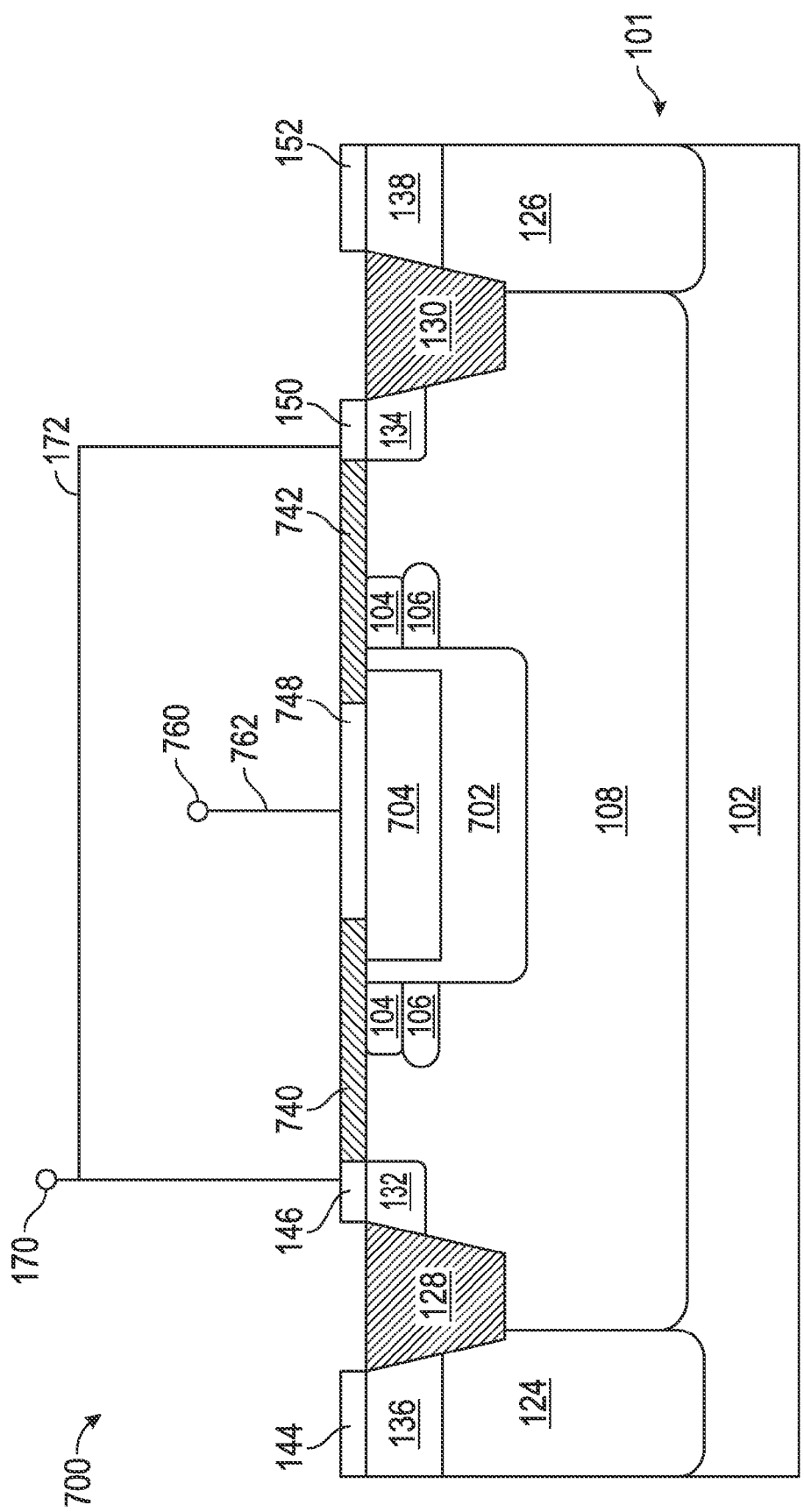
FIG. 7 depicts a cross-sectional view of an exemplary Zener diode device structure including a heavier-doped anode contact region in accordance with one or more embodiments of the invention.

FIG. 7 depicts another embodiment of a Zener diode semiconductor device structure 700 that includes a relatively heavily-doped anode contact region 704 that is electrically connected to the anode region 104 via a relatively lightly-doped anode interconnect region 702. In this regard, the anode contact region 704 has a dopant concentration that is greater than that of the anode region 104 to support formation of a lower resistance anode contact 748. In one or more exemplary embodiments, the depth of the anode contact region 704 relative to the surface of the substrate 101 is greater than that of the anode region 104. For example, the anode contact region 704 may be formed by implanting ions of the same conductivity-determining impurity type as the anode region 104 with a dopant concentration in the range of about $1 \times 10^{19}/cm^3$ to about $1 \times 10^{21}/cm^3$ and at an energy level in the range of about 2 keV to about 50 keV to provide the anode contact region 704 with a depth (after diffusion) that is greater than or equal to the depth of the anode region 104.

As illustrated, the anode contact region 704 is formed within a lighter doped anode interconnect region 702 having the same conductivity as the anode region 104 and the contact region 704. The anode interconnect region 702 abuts the anode region 104 and the anode contact region 704 to provide an electrical connection between the anode contact region 704 and the anode region 104. The dopant concentration of the anode interconnect region 702 is less than that of the anode region 104 to ensure that the lowest reverse breakdown voltage occurs along the vertical Zener junction between the anode region 104 and the cathode region 106. Additionally, the depth of the interconnect region 702 relative to the surface of the substrate 101 is greater than that of both the anode region 104 and the anode interconnect region 704. For example, the anode interconnect region 702 may be formed by implanting ions of the same conductivity-determining impurity type as the anode region 104 with a dopant concentration in the range of about $5 \times 10^{15}/cm^3$ to about $5 \times 10^{17}/cm^3$ and at an energy level chosen to provide the anode interconnect region 702 with a depth (after diffusion) that is greater than the depth of the anode contact region 704 (which is greater than or equal to the depth of the anode region 104). In exemplary embodiments, the depth of the anode interconnect region 702 is greater than the cathode region 106 and greater than the depth of the anode contact region 704 to provide a margin between the anode contact region 704 and the cathode well region 108 that ensures breakdown does not occur between the anode contact region 704 and the cathode well region 108 before the vertical Zener junction between the anode and cathode regions 104, 106 breaks down. In exemplary embodiments where the Zener diode structure 100 is fabricated using a CMOS fabrication process, the anode contact region 704 may be formed concurrently to forming p-type source/drain contact regions for PMOS logic transistors on other regions of the substrate 101 and the anode interconnect region 702 may be formed concurrently to forming p-type well regions for NMOS logic transistors on other regions of the substrate 101.

In a similar manner as described above, an anode contact 748 is formed on the anode contact region 704 concurrently to forming contacts 144, 146, 150, 152 and an electrical connection 762 is provided between the anode contact 748 and a lower voltage circuit node 760. It should be noted that in the embodiment of FIG. 7, the contact blocking material 740, 742 is formed overlying the anode region 104 and at least a portion of the cathode well region 108 adjacent to the anode region 104 to prevent the formation of contacts overlying the anode region 104.

Figure 8:
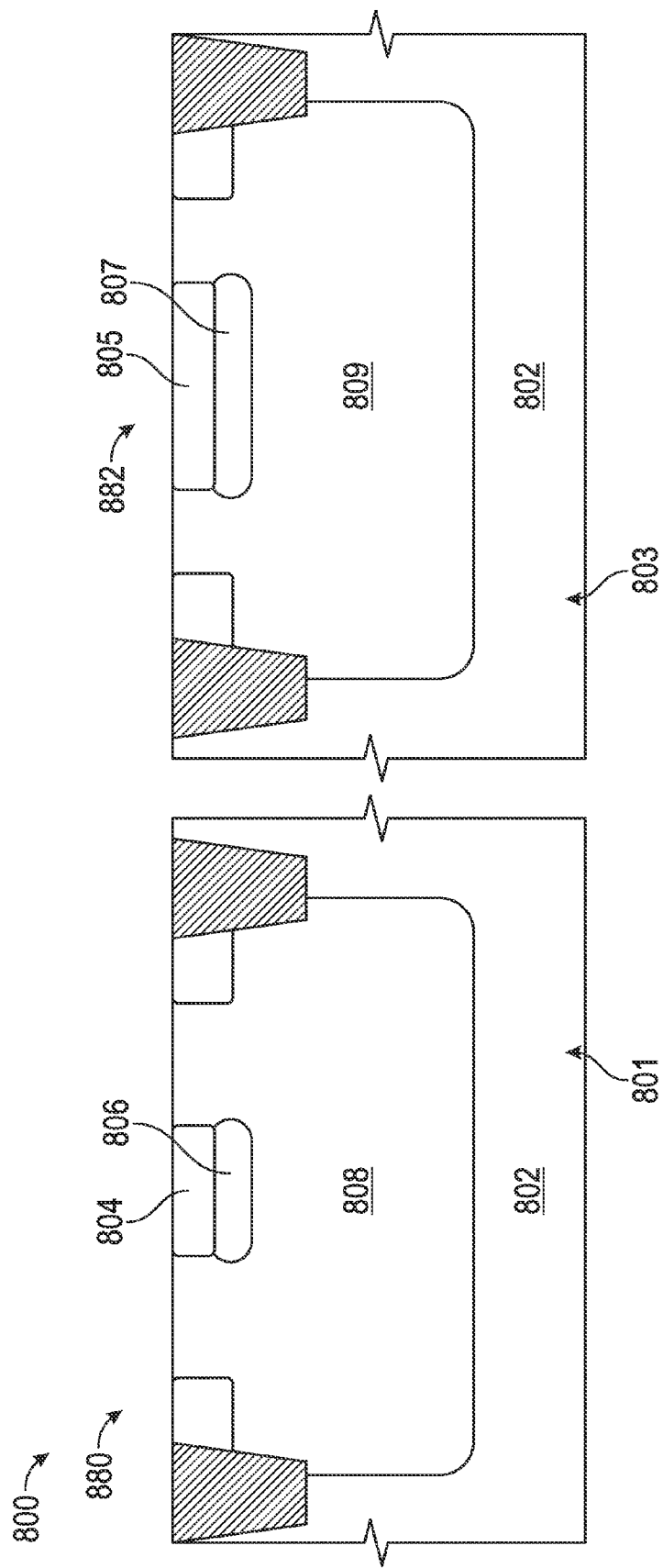
FIG. 8 depicts a cross-sectional view of an exemplary semiconductor device structure including multiple Zener diode device structures in accordance with one or more embodiments of the invention.

FIG. 8 depicts a semiconductor device structure 800 that includes multiple instances of the Zener diode semiconductor device structures 880, 882 described herein. In this regard, a first instance of a Zener diode semiconductor device structure 880 is fabricated on a first region 801 of a die, wafer, or other semiconductor substrate 802, and a second instance of a Zener diode semiconductor device structure 882 is fabricated on a second region 803 of the semiconductor substrate 803. In exemplary embodiments, the corresponding regions of the different Zener diode semiconductor device structures 880, 882 are formed or otherwise fabricated concurrently to one another in the different regions 801, 803 of the semiconductor substrate 802, while the lateral dimension of one or more of the anode and cathode regions 804, 806 of the first Zener diode 880 are different from the lateral dimension of one or more of the anode and cathode regions 805, 807 of the second Zener diode 882. As a result, the reverse breakdown voltage of the Zener junction between the anode and cathode regions 804, 806 of the first Zener diode 880 is different from the reverse breakdown voltage of the Zener junction between the anode and cathode regions 805, 807 of the second Zener diode 882.

For example, well regions 808, 809 may be formed in the different regions 801, 803 of the semiconductor substrate 800 concurrently as part of the same ion implantation process step such that the well regions 808, 809 have substantially the same dopant concentration. Thereafter, relatively heavily-doped cathode regions 806, 807 are formed within the well regions 808, 809 as part of the same ion implantation process step such that the cathode regions 806, 807 have substantially the same dopant concentration, but the lateral dimensions for the opening in the implantation mask that corresponds to the first cathode region 806 may be different from the lateral dimensions for the opening in the implantation mask that corresponds to the second cathode region 807. Similarly, the relatively heavily-doped anode regions 804, 805 are also formed as part of the same ion implantation process step such that the anode regions 804, 805 have substantially the same dopant concentration, while the lateral dimensions for the opening in the implantation mask that corresponds to the first anode region 804 may be different from the lateral dimensions for the opening in the implantation mask that corresponds to the second anode region 805. Thus, the length and/or width of the first cathode region 806 may be greater than or less than the length and/or width of the second cathode region 807 and the length and/or width of the first anode region 804 may be greater than or less than the length and/or width of the second anode region 805. Additionally, the length and/or width of the first cathode region 806 may be greater than or less than the length and/or width of the first anode region 804 and the length and/or width of the second cathode region 807 may be greater than or less than the length and/or width of the second anode region 805. Varying the lateral dimensions of the anode region 804, 805 and/or cathode region 806, 807 of a respective Zener diode 880, 882 varies the amount of influence the depletion region of the lateral junction with the surrounding well region 808, 809 has on the depletion region between the anode and cathode regions 804, 805, 806, 807 of the respective Zener diode 880, 882. Thus, while the relative dopant concentrations between the anode and cathode regions 804, 806 of the first Zener diode 880 are the same as the relative dopant concentrations between the anode and cathode regions 805, 807 of the second Zener diode 882, the reverse breakdown voltage of the first Zener diode 880 is different from the reverse breakdown voltage of the second Zener diode 882 by virtue of the different physical dimensions of the anode region 804 and/or the cathode region 806 of the first Zener diode 880 with respect to the physical dimensions of the anode region 805 and/or the cathode region 807 of the second Zener diode 882 increasing and/or decreasing the influence of the first well region 808 on the vertical junction between anode and cathode regions 804, 806 relative to the influence of the second well region 809 on the vertical junction between anode and cathode regions 805, 807.

For the sake of brevity, conventional techniques related to semiconductor and/or integrated circuit fabrication, ESD protection schemes, and other functional aspects of the subject matter may not be described in detail herein. In addition, certain terminology may be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a semiconductor device is provided. The semiconductor device comprises a semiconductor substrate, a first Zener diode structure on the semiconductor substrate, and a second Zener diode structure on the semiconductor substrate. The first Zener diode structure includes a first region having a first conductivity type and a first dopant concentration, a second region having a second conductivity type and a second dopant concentration, the second region being adjacent to the first region to provide a first junction between the first region and the second region, and a third region adjacent to the first region and the second region to provide a second junction between the third region and one of the first region or the second region, wherein the second junction is configured to influence a first reverse breakdown voltage of the first junction. The second Zener diode structure includes a fourth region having the first conductivity type and the first dopant concentration, a fifth region having the second conductivity type and the second dopant concentration, the fifth region being adjacent to the fourth region to provide a third junction between the fourth region and the fifth region, and a sixth region adjacent to the fourth region and the fifth region to provide a fourth junction between the sixth region and one of the fourth region or the fifth region, wherein the fourth junction is configured to influence a second reverse breakdown voltage of the third junction and the second reverse breakdown voltage and the first reverse breakdown voltage are different. In one or more embodiments, the second junction is angled with respect to the first junction or substantially orthogonal to the first junction. In another embodiment, the first region overlies the second region, the first junction comprises a vertical junction between the first region and the second region, the second junction comprises a lateral junction between the third region and the one of the first region or the second region, and the lateral junction influences the first reverse breakdown voltage of the vertical junction. In one embodiment, a third reverse breakdown voltage of the lateral junction is greater than the first reverse breakdown voltage of the vertical junction. In another embodiment, the third region has the second conductivity type to provide the lateral junction between the third region and the first region. In one embodiment, a dopant concentration of the third region is less than the second dopant concentration of the second region. In another embodiment, the second dopant concentration of the second region is greater than the first dopant concentration of the first region. In accordance with another embodiment, the third region has the first conductivity type to provide the lateral junction between the third region and the second region. In one embodiment, the first dopant concentration of the first region is greater than the second dopant concentration of the second region. In another embodiment, a dopant concentration of the third region is greater than the first dopant concentration of the first region. In yet another embodiment, the first region comprises an anode region, the second region comprises a cathode region, and the third region comprises an anode enhancement region. In another embodiment, the third region laterally circumscribes the first region and the second region. In yet another embodiment, the first junction comprises a lateral junction between the first region and the second region, the second junction comprises a vertical junction between the third region and the one of the first region or the second region, the vertical junction influences the first reverse breakdown voltage of the lateral junction, and a third reverse breakdown voltage of the vertical junction is greater than the first reverse breakdown voltage of the lateral junction. In another embodiment, the third region and the sixth region have a third dopant concentration. In one embodiment, a lateral dimension of one of the first region and the second region is different from that lateral dimension of one of the third region and the fourth region.

In another embodiment, an exemplary semiconductor device comprises a semiconductor substrate, a first Zener diode structure on the semiconductor substrate, and a second Zener diode structure on the semiconductor substrate. The first Zener diode structure includes a first anode region having a first conductivity type and a first dopant concentration, a first cathode region having a second conductivity type and a second dopant concentration, the first anode region overlying and abutting the first cathode region to provide a first vertical Zener junction between the first anode region and the first cathode region, and a first well region adjacent to the first anode region and the first cathode region to provide a first lateral junction between the first well region and one of the first anode region or the first cathode region, wherein the first lateral junction is configured to influence a first reverse breakdown voltage of the first vertical Zener junction. The second Zener diode structure includes a second anode region having the first conductivity type and the first dopant concentration, a second cathode region having the second conductivity type and the second dopant concentration, the second anode region overlying and abutting the second cathode region to provide a second vertical Zener junction between the second anode region and the second cathode region, and a second well region adjacent to the second anode region and the second cathode region to provide a second lateral junction between the second well region and one of the second anode region or the second cathode region, wherein the second lateral junction is configured to influence a second reverse breakdown voltage of the second vertical Zener junction. The second reverse breakdown voltage and the first reverse breakdown voltage are different. In one embodiment, the first well region and the second well region have a third dopant concentration, wherein the third dopant concentration is greater than the first dopant concentration or the second dopant concentration.

In another embodiment, a method of fabricating a semiconductor device structure on a semiconductor substrate is provided. The method comprises concurrently forming a first region and a second region in the semiconductor substrate, the first region and the second region having a first conductivity type and a first dopant concentration, and concurrently forming a third region and a fourth region in the semiconductor substrate, the third region and the fourth region having a second conductivity type and a second dopant concentration. The third region is adjacent to the first region to provide a first junction between the first region and the third region and the fourth region is adjacent to the second region to provide a second junction between the second region and the fourth region, wherein a first reverse breakdown voltage of the first junction is different from a second reverse breakdown voltage of the second junction. In one embodiment, concurrently forming the first region and the second region comprises forming the first region having a lateral dimension that is different from that lateral dimension of the second region. A fifth region in the semiconductor substrate adjacent to the first region and the third region provides a third junction between the fifth region and one of the first region or the third region, and the third junction influences the first reverse breakdown voltage of the first junction.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
   a semiconductor substrate;
   a first Zener diode structure on the semiconductor substrate, the first Zener diode structure including:
      a first region having a first conductivity type and a first dopant concentration;
      a second region having a second conductivity type and a second dopant concentration, the second region being adjacent to the first region to provide a vertical junction between the first region and the second region, the first region overlying the second region; and
      a third region adjacent to the first region and the second region to provide a lateral junction between the third region and one of the first region or the second region, wherein the lateral junction is configured to influence a first reverse breakdown voltage of the vertical junction; and
   a second Zener diode structure on the semiconductor substrate, the second Zener diode structure including:
      a fourth region having the first conductivity type and the first dopant concentration;
      a fifth region having the second conductivity type and the second dopant concentration, the fifth region being adjacent to the fourth region to provide a third junction between the fourth region and the fifth region; and
      a sixth region adjacent to the fourth region and the fifth region to provide a fourth junction between the sixth region and one of the fourth region or the fifth region, wherein the fourth junction is configured to influence a second reverse breakdown voltage of the third junction, wherein:
         the second reverse breakdown voltage and the first reverse breakdown voltage are different; and
         a third reverse breakdown voltage of the lateral junction is greater than the first reverse breakdown voltage of the vertical junction.

2. The semiconductor device of claim 1, wherein the lateral junction is angled with respect to the vertical junction.

3. The semiconductor device of claim 2, wherein the lateral junction is substantially orthogonal to the vertical junction.

4. The semiconductor device of claim 1, wherein the third region has the second conductivity type to provide the lateral junction between the third region and the first region.

5. The semiconductor device of claim 4, wherein a dopant concentration of the third region is less than the second dopant concentration of the second region.

6. The semiconductor device of claim 4, wherein the second dopant concentration of the second region is greater than the first dopant concentration of the first region.

7. The semiconductor device of claim 1, wherein the third region has the first conductivity type to provide the lateral junction between the third region and the second region.

8. The semiconductor device of claim 7, wherein the first dopant concentration of the first region is greater than the second dopant concentration of the second region.

9. The semiconductor device of claim 7, wherein a dopant concentration of the third region is greater than the first dopant concentration of the first region.

10. The semiconductor device of claim 7, wherein:
the first region comprises an anode region;
the second region comprises a cathode region; and
the third region comprises an anode enhancement region.

11. The semiconductor device of claim 1, wherein the third region laterally circumscribes the first region and the second region.

12. The semiconductor device of claim 1, wherein the third region and the sixth region have a third dopant concentration.

13. The semiconductor device of claim 1, wherein a lateral dimension of one of the first region and the second region is different from that lateral dimension of one of the third region and the fourth region.

14. A method of fabricating a semiconductor device structure on a semiconductor substrate, the method comprising:
concurrently forming a first region and a second region in the semiconductor substrate, the first region and the second region having a first conductivity type and a first dopant concentration, the first region having a lateral dimension that is different from that lateral dimension of the second region; and
concurrently forming a third region and a fourth region in the semiconductor substrate, the third region and the fourth region having a second conductivity type and a second dopant concentration, the third region being adjacent to the first region to provide a first junction between the first region and the third region and the fourth region being adjacent to the second region to provide a second junction between the second region and the fourth region, wherein:
a first reverse breakdown voltage of the first junction is different from a second reverse breakdown voltage of the second junction;
a fifth region in the semiconductor substrate adjacent to the first region and the third region provides a third junction between the fifth region and one of the first region or the third region; and
the third junction influences the first reverse breakdown voltage of the first junction.

15. A semiconductor device comprising:
a semiconductor substrate;
a first Zener diode structure on the semiconductor substrate, the first Zener diode structure including:
an anode region having a first conductivity type and a first dopant concentration;
a cathode region having a second conductivity type and a second dopant concentration, the anode region overlying the cathode region and the cathode region being adjacent to the anode region to provide a vertical junction between the anode region and the cathode region; and
an anode enhancement region having the first conductivity type adjacent to the anode region and the cathode region to provide a lateral junction between the anode enhancement region and the cathode region, wherein the lateral junction is configured to influence a first reverse breakdown voltage of the vertical junction; and
a second Zener diode structure on the semiconductor substrate, the second Zener diode structure including:
a fourth region having the first conductivity type and the first dopant concentration;
a fifth region having the second conductivity type and the second dopant concentration, the fifth region being adjacent to the fourth region to provide a third junction between the fourth region and the fifth region; and
a sixth region adjacent to the fourth region and the fifth region to provide a fourth junction between the sixth region and one of the fourth region or the fifth region, wherein the fourth junction is configured to influence a second reverse breakdown voltage of the third junction, wherein:
the second reverse breakdown voltage and the first reverse breakdown voltage are different.

16. A semiconductor device comprising:
a semiconductor substrate;
a first Zener diode structure on the semiconductor substrate, the first Zener diode structure including:
a first region having a first conductivity type and a first dopant concentration;
a second region having a second conductivity type and a second dopant concentration, the second region being adjacent to the first region to provide a lateral junction between the first region and the second region; and
a third region adjacent to the first region and the second region to provide a vertical junction between the third region and one of the first region or the second region, wherein the vertical junction is configured to influence a first reverse breakdown voltage of the lateral junction; and
a second Zener diode structure on the semiconductor substrate, the second Zener diode structure including:
a fourth region having the first conductivity type and the first dopant concentration;
a fifth region having the second conductivity type and the second dopant concentration, the fifth region being adjacent to the fourth region to provide a third junction between the fourth region and the fifth region; and
a sixth region adjacent to the fourth region and the fifth region to provide a fourth junction between the sixth region and one of the fourth region or the fifth region, wherein the fourth junction is configured to influence a second reverse breakdown voltage of the third junction, wherein:
the second reverse breakdown voltage and the first reverse breakdown voltage are different; and
a third reverse breakdown voltage of the vertical junction is greater than the first reverse breakdown voltage of the lateral junction.

* * * * *